(12) United States Patent
Ku

(10) Patent No.: US 12,222,778 B2
(45) Date of Patent: Feb. 11, 2025

(54) SERVER AND EXPANSION TRAY THEREOF

(71) Applicant: Wistron Corporation, New Taipei (TW)

(72) Inventor: Shang-Lun Ku, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 249 days.

(21) Appl. No.: 17/751,891

(22) Filed: May 24, 2022

(65) Prior Publication Data

US 2023/0236644 A1 Jul. 27, 2023

(30) Foreign Application Priority Data

Jan. 27, 2022 (TW) .................................. 111103775

(51) Int. Cl.
*G06F 1/18* (2006.01)
*H05K 7/14* (2006.01)

(52) U.S. Cl.
CPC .............. *G06F 1/185* (2013.01); *G06F 1/184* (2013.01); *H05K 7/1418* (2013.01); *H05K 7/1489* (2013.01)

(58) Field of Classification Search
CPC ....... G06F 1/185; G06F 1/184; H05K 7/1418; H05K 7/1489; H05K 7/18; H05K 5/02; H05K 7/1429
See application file for complete search history.

(56) References Cited

U.S. PATENT DOCUMENTS

| | | | |
|---|---|---|---|
| 8,405,966 B2 * | 3/2013 | Hartman | G06F 1/186 361/726 |
| 11,310,932 B2 * | 4/2022 | Chang | H05K 7/16 |
| 2015/0070858 A1 * | 3/2015 | Wu | H05K 7/1417 361/807 |

FOREIGN PATENT DOCUMENTS

| | | |
|---|---|---|
| TW | 202027580 A | 7/2020 |
| TW | I734520 B | 7/2021 |

OTHER PUBLICATIONS

Examination report dated Sep. 28, 2022, listed in related Taiwan patent application No. 111103775.

* cited by examiner

Primary Examiner — Sagar Shrestha
Assistant Examiner — Peter Krim
(74) Attorney, Agent, or Firm — McClure, Qualey & Rodack, LLP

(57) ABSTRACT

A server includes a server motherboard, a limiting element, and an expansion tray. The limiting element has a limiting portion and the limiting element is fixed to the server motherboard. The expansion tray includes a tray body, a driven assembly, and a matching element. The driven assembly includes a positioning element and is fixed to the tray body. The matching element is fixed to the tray body and the matching element is matched with the limiting element. The positioning element has a first position and a second position. The positioning element is located at the limiting portion in response to the positioning element being located at the second position.

12 Claims, 10 Drawing Sheets

SERVER AND EXPANSION TRAY THEREOF

CROSS-REFERENCE TO RELATED APPLICATION

This non-provisional application claims priority under 35 U.S.C. § 119(a) to Patent Application No. 111103775 filed in Taiwan, R.O.C. on Jan. 27, 2022, the entire contents of which are hereby incorporated by reference.

BACKGROUND

Technical Field

The present disclosure relates to a server, and in particular, to a server including an expansion circuit board.

Related Art

With the advancement of science and technology, people have growing demand for cloud computing devices, causing a huge increase in demand for servers. Related tests need to be performed on a server after assembly. For example, a vibration test is first performed on the server, and then a power-on test is performed, to ensure the normal operation of the server after the vibration test. Currently, to improve the operation efficiency, the server usually includes a plurality of layers of circuit boards, and the circuit boards are electrically connected to each other by using connectors. After the vibration test, the server including the plurality of layers of circuit boards is prone to be in poor contact with the connectors, and consequently the server cannot be successfully powered on.

SUMMARY

To resolve the foregoing problem, this disclosure provides a server. According to some embodiments, the server includes a server motherboard, a limiting element, and an expansion tray. The limiting element has a limiting portion and the limiting element is fixed to the server motherboard. The expansion tray includes a tray body, a driven assembly, and a matching element. The driven assembly includes a positioning element and is fixed to the tray body. The matching element is fixed to the tray body and the matching element is matched with the limiting element. The positioning element has a first position and a second position. The positioning element is located at the limiting portion in response to the positioning element being located at the second position.

In some embodiments, the driven assembly includes a first gear and a second gear, the first gear and the second gear are respectively pivotally connected to the tray body, and the first gear is engaged with the second gear; and the positioning element includes a positioning pin and a connecting arm, the connecting arm is connected between the first gear and the positioning pin.

In some embodiments, the driven assembly includes a first connecting rod, a second connecting rod, and a third connecting rod that are pivotally connected in sequence, and the first connecting rod and the third connecting rod are further pivotally connected to the tray body; and the positioning element includes a positioning pin and a connecting arm, the connecting arm is connected between the first connecting rod and the positioning pin, and in response to the first connecting rod being actuated, the first connecting rod enables the positioning pin to move between the first position and the second position.

In some embodiments, the limiting element is a limiting post, the matching element is a sleeve, the sleeve is sleeved on the limiting post, and the limiting portion is exposed from the sleeve. Alternatively, in some other embodiments, the limiting element is a sleeve, and the matching element is a limiting post.

This disclosure provides an expansion tray adapted to a server motherboard. The server motherboard includes a limiting element, and the limiting element has a limiting portion. The expansion tray includes a tray body, a driven assembly, and a matching element. The driven assembly includes a positioning element and is fixed to the tray body. The matching element is fixed to the tray body and the matching element is matched with the limiting element. The positioning element has a first position and a second position. The positioning element is located at the limiting portion in response to the positioning element being located at the second position.

Based on the above, the expansion tray is fixed to the limiting element of the server motherboard by using the positioning element, and the positioning element is limited by the limiting portion of the limiting element, so that the expansion tray and the server motherboard are firmly connected to each other.

Various embodiments are described in detail below. However, the embodiments are merely used as examples for description and are not intended to narrow the protection scope of the present invention. In addition, some assemblies may be omitted in the accompanying drawings in the embodiments, to clearly show technical features of the present invention. The same reference numerals are used to denote the same or similar assemblies in all of the accompanying drawings.

DETAILED DESCRIPTION

Some embodiments of the present invention are disclosed below with reference to the accompanying drawings. For clear descriptions, many practical details are described together in the following descriptions, which are not intended to limit the patent claims of the present invention.

Figure 1:
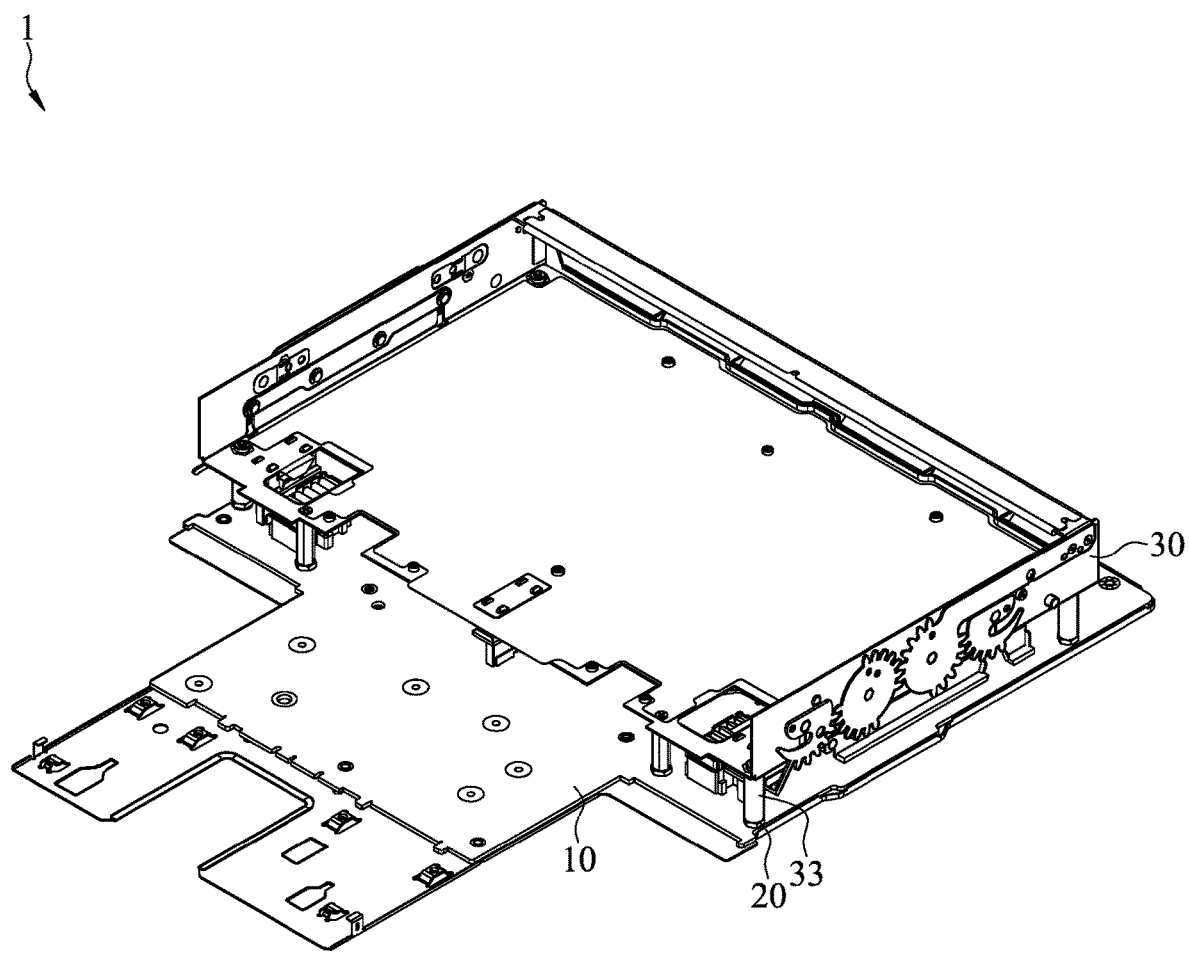
FIG. 1 is a three-dimensional view of a server according to some embodiments of the present invention.
Figure 2:
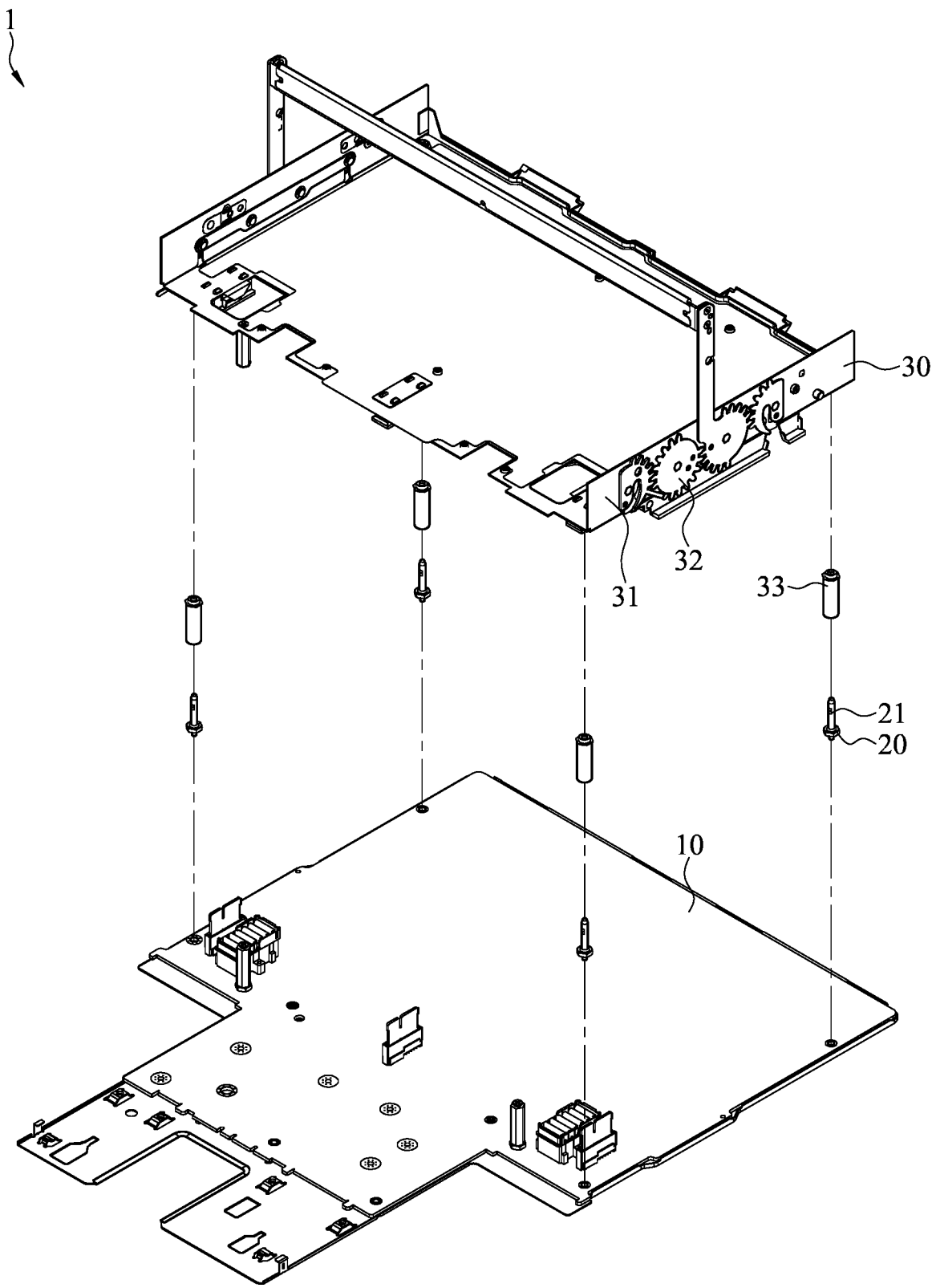
FIG. 2 is a three-dimensional exploded view of the server according to some embodiments of the present invention.
Figure 3A:
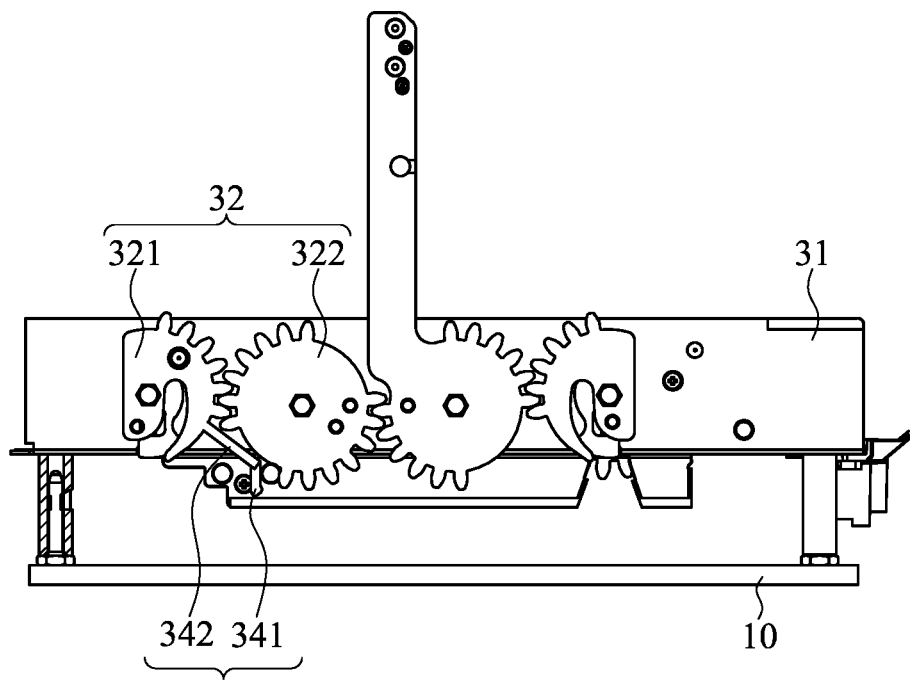
FIG. 3A is a schematic diagram of a state in which a positioning element is located at a first position according to some embodiments of the present invention.
Figure 3B:
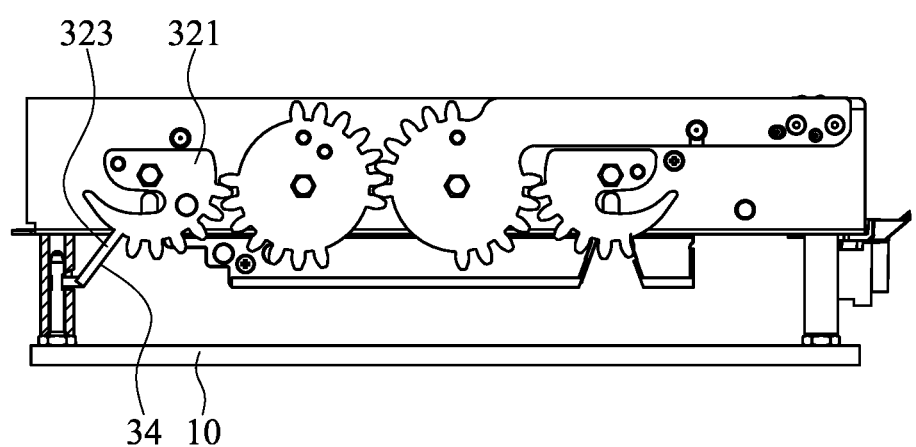
FIG. 3B is a schematic diagram of a state in which the positioning element is located at a second position according to some embodiments of the present invention.

Referring to FIG. 1 and FIG. 2 together, FIG. 1 is a three-dimensional view of a server according to some embodiments of the present invention. FIG. 2 is a three-dimensional exploded view of the server according to some embodiments of the present invention. According to some embodiments, the server 1 includes a server motherboard 10, a limiting element 20, and an expansion tray 30. The limiting element 20 has a limiting portion 21 and the limiting element 20 is fixed to the server motherboard 10. The expansion tray 30 includes a tray body 31, a driven assembly 32, and a matching element 33. The driven assembly 32 includes a positioning element 34 (as shown in FIG. 3A and FIG. 3B) and is fixed to the tray body 31. The matching element 33 is fixed to the tray body 31 and the matching element 33 is matched with the limiting element 20. The positioning element 34 has a first position and a second position. The positioning element 34 is located at the limiting portion 21 in response to the positioning element 34 being located at the second position. According to some embodiments, the driven assembly 32 may be a gear, a gear assembly, a linkage or a linage assembly.

The server 1 may be a tower server, a rack server, a blade server, a cabinet server, or the like. The expansion tray 30 is adapted to carry an expansion circuit board (not shown in the figure). The expansion circuit board is fixed to the expansion tray 30 (to be described below). During use, a user may moves the positioning element 34 between the first position and the second position by using the linkage assembly 32. The positioning element 34 is located at the limiting portion 21 in response to the user moving the positioning element 34 to the second position by using the linkage assembly 32. Therefore, the expansion tray 30 is fixed to the server motherboard 10, and the expansion circuit board is also electrically connected to the server motherboard 10 (to be described in detail below). In some embodiments, the positioning element 34 is clamped in the limiting portion 21 (to be described in detail below). In response to the positioning element 34 being appropriately designed at the second position, an electrical connection between the expansion circuit board and the server motherboard 10 may be more stable based on a connection relationship between the positioning element 34 and the limiting portion 21, so that the server 1 meets requirements of a vibration test.

In some embodiments, the limiting element 20 is locked on the server motherboard 10, the matching element 33 is locked on the expansion tray 30, and the limiting element 20 corresponds to the matching element 33 in response to the server motherboard 10 being connected to the expansion tray 30. The limiting portion 21 of the limiting element 20 may be a fixing hole or a fixing groove (to be described below). In response to the positioning element 34 being located at the second position, the positioning element 34 is located at the limiting portion 21 (the fixing hole or the fixing groove), a limiting effect is generated between the positioning element 34 and the limiting portion 21 of the limiting element 20, so that a relative position between the server motherboard 10 and the expansion tray 30 can be stably maintained.

In some embodiments, the linkage assembly 32 may be pivotally connected on one side or two sides of the tray body 31. According to a disposition position of the linkage assembly 32, the user drives the linkage assembly 32 to actuate, so that in response to the positioning element 34 being moved from the first position to the second position, the positioning element 34 may correspond to the limiting portion 21 of the limiting element 20 and is located inside the limiting portion 21.

Referring to FIG. 3A, FIG. 3A is a schematic diagram of a state in which a positioning element is located at a first position according to some embodiments of the present invention. In some embodiments, the linkage assembly 32 is a gear train. As shown in the figure, the linkage assembly 32 includes a first gear 321 and a second gear 322. The gear train includes the first gear 321, the second gear 322, a third gear, and a fourth gear that are sequentially shown from left to right in the figure. In some embodiments, the linkage assembly 32 only includes the first gear 321 and the second gear 322. The first gear 321 and the second gear 322 are respectively pivotally connected to the tray body 31, and the first gear 321 is engaged with the second gear 322. In some embodiments, the positioning element 34 includes a positioning pin 341 and a connecting arm 342, and the connecting arm 342 is connected between the first gear 321 and the positioning pin 341. According to some embodiments, in response to the second gear 322 being actuated, the first gear 321 enables the positioning pin 341 to move between the first position and the second position. According to some embodiments, in response to the first gear 321 being actuated, the first gear 321 enables the positioning pin 341 to move between the first position and the second position. As shown in FIG. 3A, in response to the user rotating the second gear 322 (for example, clockwise or counterclockwise), the second gear 322 and the first gear 321 are linked, the connecting arm 342 connected to the first gear 321 swings along with the first gear 321, and the positioning pin 341 located at the other end of the connecting arm 342 also swings between the first position (as the position shown in FIG. 3A) and the second position (as the position shown in FIG. 3B) along with the connecting arm 342. The positioning pin 341 is far away from the limiting element 20 in response to the user actuating the second gear 322 and enables the positioning pin 341 to be located at the first position (as the position shown in FIG. 3A). Referring to FIG. 3B, FIG. 3B is a schematic diagram of a state in which the positioning element is located at a second position according to some embodiments of the present invention. The positioning pin 341 is located at the limiting portion 21 in response to the user rotating the second gear 322 and enables the positioning pin 341 to be located at the second position. The positioning pin 341 is moved between the first position and the second position based on the linkage between the first gear 321 and the second gear 322. Because the connecting arm 342 is connected to the first gear 321 and the positioning pin 341, in this embodiment, the connecting arm 342 is linked to the first gear 321, so that the positioning pin 341 swings in an arc between the first position and the second position.

Figure 4:
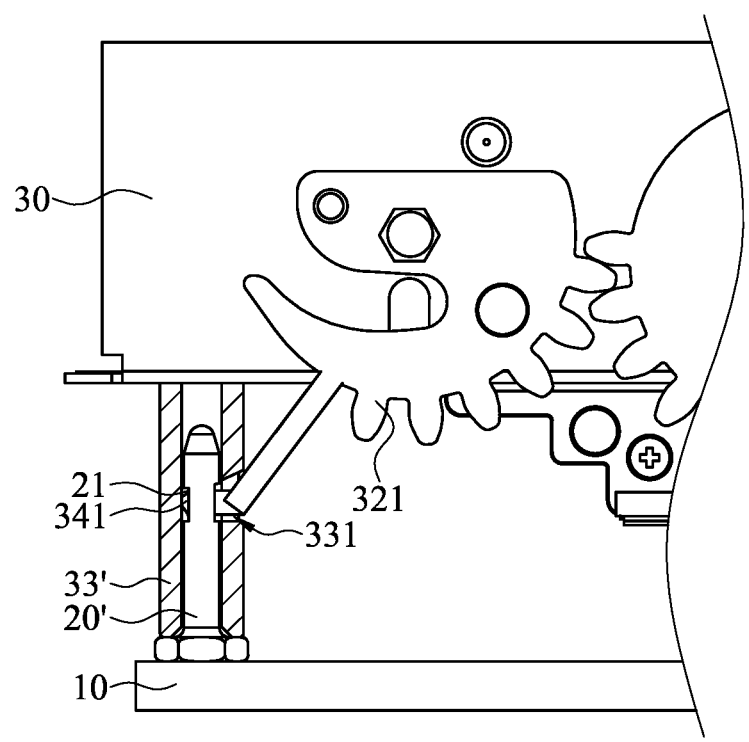
FIG. 4 is a partially enlarged view in which the positioning element is located at the second position according to some embodiments of the present invention.

Referring to FIG. 4, FIG. 4 is a partially enlarged view in which the positioning element is located at the second position according to some embodiments of the present invention. As shown in FIG. 4, in some embodiments, the limiting element (as the limiting element 20 shown in FIG. 1) is a limiting post 20', and the matching element (as the matching element 33 shown in FIG. 1) is a sleeve 33'. The sleeve 33' corresponds to the limiting post 20' in response to the server motherboard 10 being connected to the expansion tray 30. In response to the expansion tray 30 being placed on the server motherboard 10, the sleeve 33' is sleeved on the limiting post 20' and is located beyond the limiting portion 21, so that the server motherboard 10 and the expansion tray 30 cannot relatively move on a plane (that is, X-Y axis). However, there may be a tolerance margin according to an actual usage state. The sleeve 33' is provided with a through hole 331, and the limiting portion 21 is exposed through the through hole 331 in response to the sleeve 33' being sleeved on the limiting post 20'. The exposure of the limiting portion 21 may enable the user to see the limiting portion 21 through the through hole 331 of the sleeve 33'. The positioning pin 341 may still smoothly be moved to the limiting portion 21 at the second position even if the sleeve 33' is sleeved beyond the limiting portion 21. The limiting portion 21 may be a fixing hole, and the positioning pin 341 may extend into the fixing hole at the second position. The limiting portion 21 may alternatively be a fixing groove, and the positioning pin 341 may be located inside the fixing groove (not passing therethrough) at the second position. The two implementations can be applied, and the present invention is not limited thereto.

Figure 5:
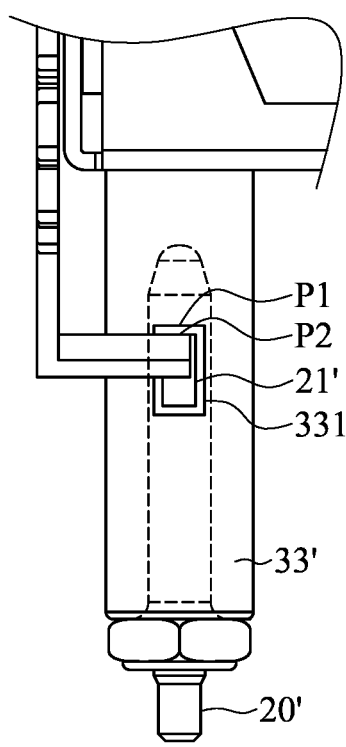
FIG. 5 is a partially enlarged right-side view of the positioning element in FIG. 4.

Referring to FIG. 5, FIG. 5 is a partially enlarged right-side view of the positioning element in FIG. 4. As shown in FIG. 4 and FIG. 5, in some embodiments, the limiting portion (as the limiting portion 21 shown in FIG. 1) is a limiting hole 21'. In response to the sleeve 33' being sleeved on the limiting post 20', the limiting hole 21' corresponds to the through hole 331, an upper edge P1 of the through hole 331 is substantially aligned with or higher than an upper edge P2 of the limiting hole 21', and the positioning pin 341 is substantially in contact with the upper edge P2 of the limiting hole 21'. Being substantially in contact may be that the positioning pin 341 (as shown in FIG. 4) is in contact with the upper edge P2 of the limiting hole 21' at the second position, the positioning pin 341 abuts against the upper edge P2 of the limiting hole 21', or the positioning pin 341 keeps a specific distance from the upper edge P2 of the limiting hole 21'. The positioning pin 341 is blocked by the limiting hole 21' after the positioning pin 341 is substantially in contact with the upper edge P2 of the limiting hole 21', to maintain a relative position between the server motherboard 10 and the expansion tray 30 unchanged.

Figure 6:
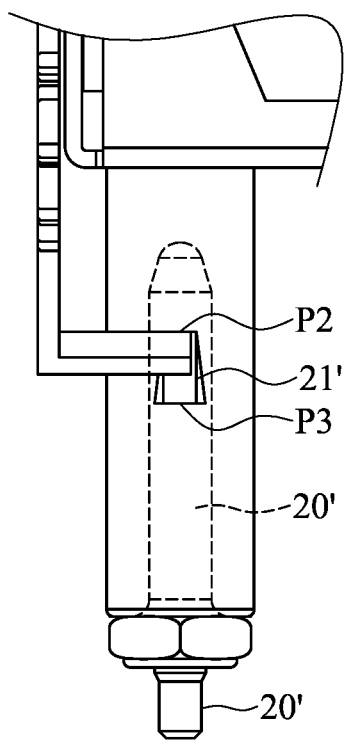
FIG. 6 is a right-side view of the positioning element according to another embodiment.

Referring to FIG. 6, FIG. 6 is a right-side view of the positioning element according to another embodiment, which is drawn in a viewing angle the same as that of FIG. 5. As shown in FIG. 4 and FIG. 6, in some embodiments, an aperture of the limiting hole 21' of the limiting post 20' gradually decreases in an entering direction of the positioning pin 341 (as shown in FIG. 4). As shown in FIG. 3A and FIG. 3B, a trajectory of the entering direction of the positioning pin 341 sequentially passes from a lower edge P3 to the upper edge P2 of the limiting hole 21' in response to the positioning pin 341 being moved from the first position to the second position. Therefore, the limiting hole 21' may gradually narrow from the lower edge P3 to the upper edge P2, so that the positioning pin 341 easily enters the limiting hole 21' from the wider lower edge P3 and is pressed by the limiting hole 21' on the narrower upper edge P2, and the positioning pin 341 is clamped in the limiting hole 21', to improve stability of the positioning pin 341 in the limiting hole 21'.

Figure 7:
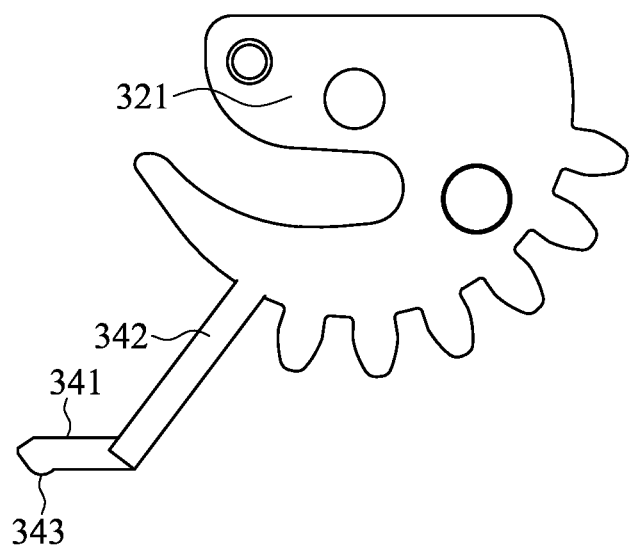
FIG. 7 is a front view of a first gear according to some embodiments of the present invention.

Referring to FIG. 7, FIG. 7 is a front view of a first gear according to some embodiments of the present invention. In some embodiments, the positioning pin 341 includes a first guiding surface 343 adapted to guide the positioning pin 341 to enter the limiting hole 21' (as the limiting hole 21' shown in FIG. 5 and FIG. 6). The first guiding surface 343 is arc-shaped. The first guiding surface 343 may play a guiding role in response to the positioning pin 341 being moved from the first position to the second position and comes into contact with the limiting hole 21' through the arc-shaped structure of the first guiding surface 343, so that the positioning pin 341 can be quickly and correctly guided to the second position. Referring to the figure again, another side surface of positioning pin 341 opposite to the first guiding surface 343 is a plane, and the another side surface may maintain a relatively large contact area (as shown in FIG. 5) with the upper edge P2 of the limiting hole 21', to improve a fixing effect of the positioning pin 341.

Figure 8:
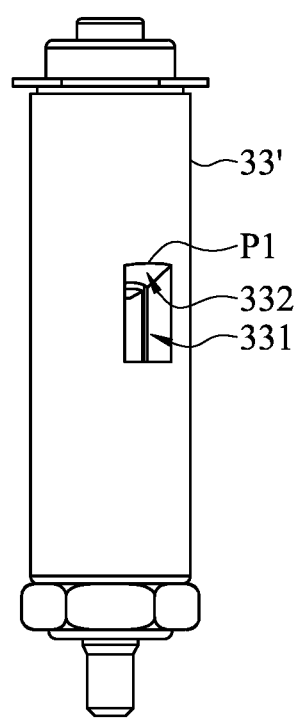
FIG. 8 is a side view of a sleeve and a limiting post according to some embodiments of the present invention.

Referring to FIG. 8, FIG. 8 is a side view of a sleeve and a limiting post according to some embodiments of the present invention. As shown in FIG. 8, the through hole 331 of the sleeve 33' includes a second guiding surface 332 adapted to guide the positioning pin 341 to enter the through hole 331. The second guiding surface 332 is disposed according to the moving trajectory from the first position to the second position (as shown in FIG. 3A and FIG. 3B) of the positioning pin 341. The second guiding surface 332 shown in FIG. 8 may be disposed on the upper edge P1 of the through hole 331, the second guiding surface 332 gradually narrows in an inclined shape from outside to inside of the through hole 331, and an inclination angle of the second guiding surface 332 may be 25 degrees or in a range of 10 degrees to 45 degrees. In response to the positioning pin 341 being moved from the first position to the second position and first comes into contact with the through hole 331, the positioning pin 341 may be guided by the inclination angle of the second guiding surface 332 to enter inside the through hole 331 along the second guiding surface 332.

Figure 9:
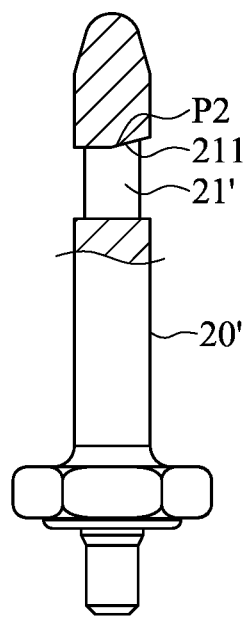
FIG. 9 is a partial cross-sectional side view of the limiting post according to some embodiments of the present invention.

Referring to FIG. 9, FIG. 9 is a partial cross-sectional side view of the limiting post according to some embodiments of the present invention. In some embodiments, the limiting hole 21' of the limiting post 20' includes a third guiding surface 211. The third guiding surface 211 is located on the upper edge P2 of the limiting hole 21' and is adapted to guide the positioning pin 341 to enter the limiting hole 21'. The third guiding surface 211 is disposed according to the moving trajectory from the first position to the second position (as shown in FIG. 3A and FIG. 3B) of the positioning pin 341. The third guiding surface 211 gradually narrows in the inclined shape from outside to inside of the limiting hole 21', and an inclination angle of the third guiding surface 211 may be 15 degrees or in a range of 5 degrees to 20 degrees. In response to the positioning pin 341 being moved from the first position to the second position and first comes into contact with the limiting hole 21', the positioning pin 341 may be guided by the inclination angle of the third guiding surface 211 to enter inside the limiting hole 21' along the third guiding surface 211. The third guiding surface 211 and the limiting hole 21' are appropriately designed, so that the third guiding surface 211 and the limiting hole 21' may be matched more closely on a plumb line (which is the plumb line shown in FIG. 9) in response to the positioning pin 341 being located in the limiting hole 21', to better maintain the relative position between the server motherboard 10 and the expansion tray 30.

Figure 10:
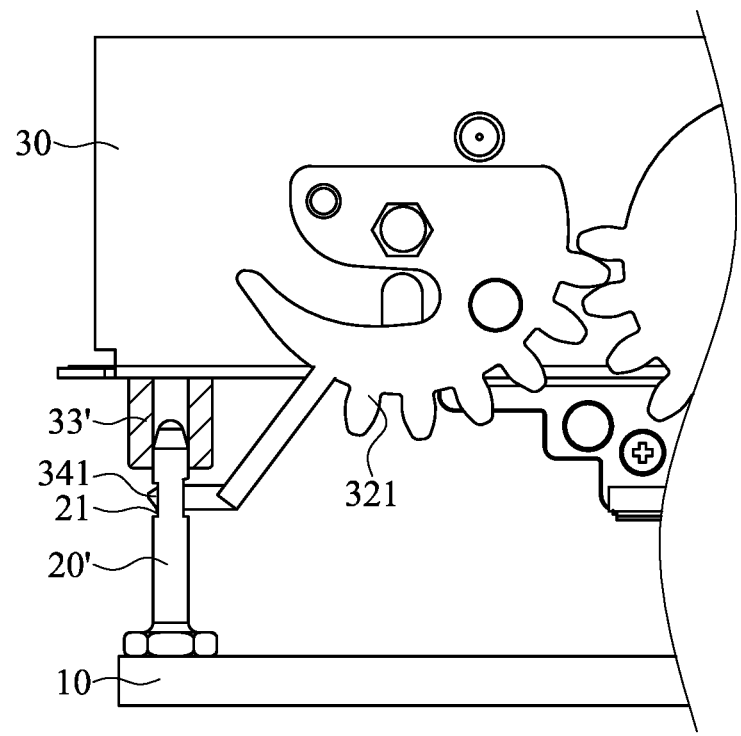
FIG. 10 is a partial cross-sectional view of the sleeve and the limiting post according to some embodiments of the present invention.

Referring to FIG. 10, FIG. 10 is a partial cross-sectional view of the sleeve and the limiting post according to some embodiments of the present invention. In some embodiments, a length of the sleeve 33' is relatively short, so that the limiting portion 21 is exposed from the sleeve 33' after the sleeve 33' is sleeved on the limiting post 20'. In response to the positioning pin 341 being located at the second position (as shown in FIG. 3B), the positioning pin 341 directly enters the limiting portion 21 without entering the limiting portion 21 through the sleeve 33'. In addition, the length of the sleeve 33' is shortened, and a limiting effect (which is limited in the horizontal direction shown in FIG. 10) is still maintained between the sleeve 33' and the limiting post 20' after the sleeve 33' is sleeved on the limiting post 20', so that the server motherboard 10 and the expansion tray 30 cannot relatively move on the plane (that is, X-Y axis).

Figure 11:
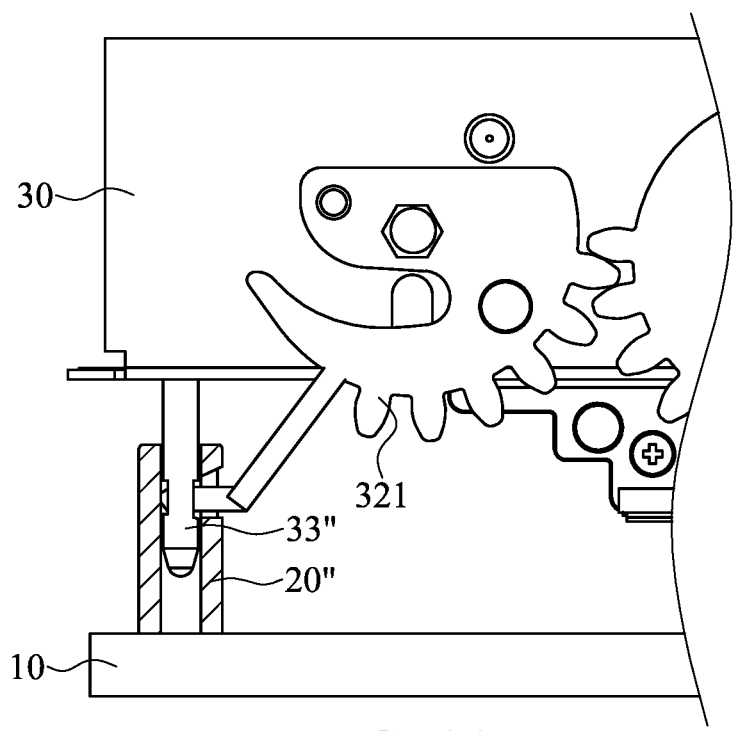
FIG. 11 is a partial cross-sectional view of the sleeve and the limiting post according to some embodiments of the present invention.

Referring to FIG. 11, FIG. 11 is a partial cross-sectional view of the sleeve and the limiting post according to some embodiments of the present invention. As shown in FIG. 11, in some embodiments, the limiting element (as the limiting element 20 shown in FIG. 1) is a sleeve 20", and the matching element (as the matching element 33 shown in FIG. 1) is a limiting post 33". The sleeve 20" of the server motherboard 10 is sleeved on the limiting post 33" of the expansion tray 30 in response to the server motherboard 10 being connected to the expansion tray 30, so that the server motherboard 10 and the expansion tray 30 cannot relatively move on the plane (that is, X-Y axis). Accordingly, the positioning element and the matching element may be a sleeve and a limiting post (as shown in FIG. 11), or a combination of a limiting post and a sleeve (as shown in FIG. 5 or FIG. 10), and the present invention is not limited thereto.

Figure 12:
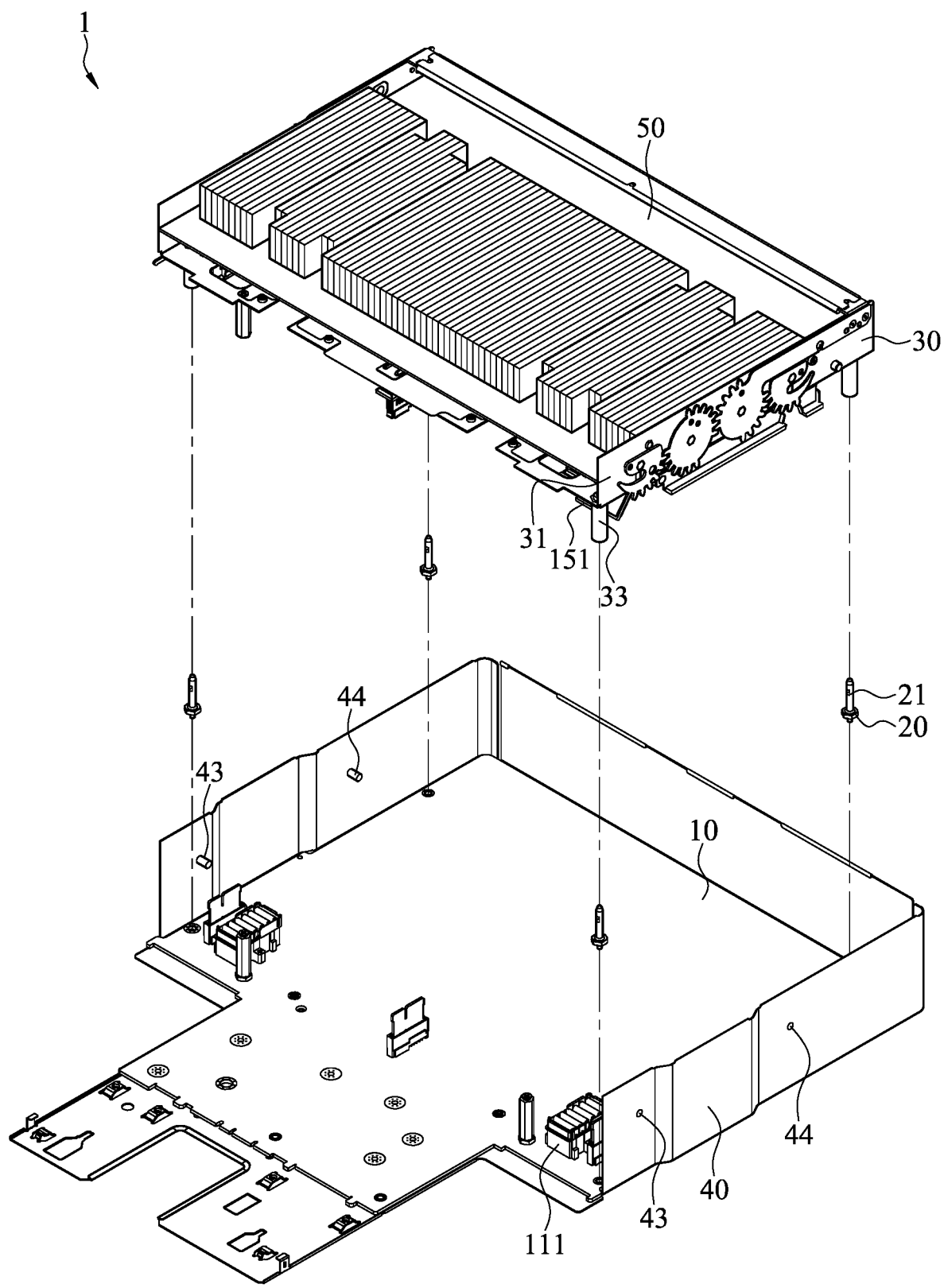
FIG. 12 is a three-dimensional exploded view of the server according to some embodiments of the present invention.

Referring to FIG. 12, FIG. 12 is a three-dimensional exploded view of the server according to some embodiments of the present invention. As shown in FIG. 1 to FIG. 12, the server 1 further includes an expansion circuit board 50. The expansion circuit board 50 includes a connector 151, and the server motherboard 10 includes a connector 111. The server motherboard 10 may be electrically connected to the expansion circuit board 50 after the two connectors (111, 151) are connected to each other. After the connector 111 of the server motherboard 10 corresponds to the connector 151 of the expansion circuit board 50, the positioning pin 341 is blocked by the limiting post 20' (as shown in FIG. 4 and FIG. 5) in response to the positioning pin 341 being moved from the first position to the second position (as shown in FIG. 3A and FIG. 3B). In this case, the expansion tray 30 may be closely adjacent to the server motherboard 10, so that the two connectors (111, 151) are connected to each other, and the expansion circuit board 50 is electrically connected to the server motherboard 10. Accordingly, after the server motherboard 10 is electrically connected to the expansion circuit board 50, the positioning pin 341 is limited by a plumb direction (that is, the plumb line shown in FIG. 12) of the limiting post 20', so that a connection state of the two connectors (111, 151) can be maintained, and during the vibration test of the server 1, the server motherboard 10 and the expansion circuit board 50 are prevented from being detached from each other to lose an electrical connection.

Figure 13:
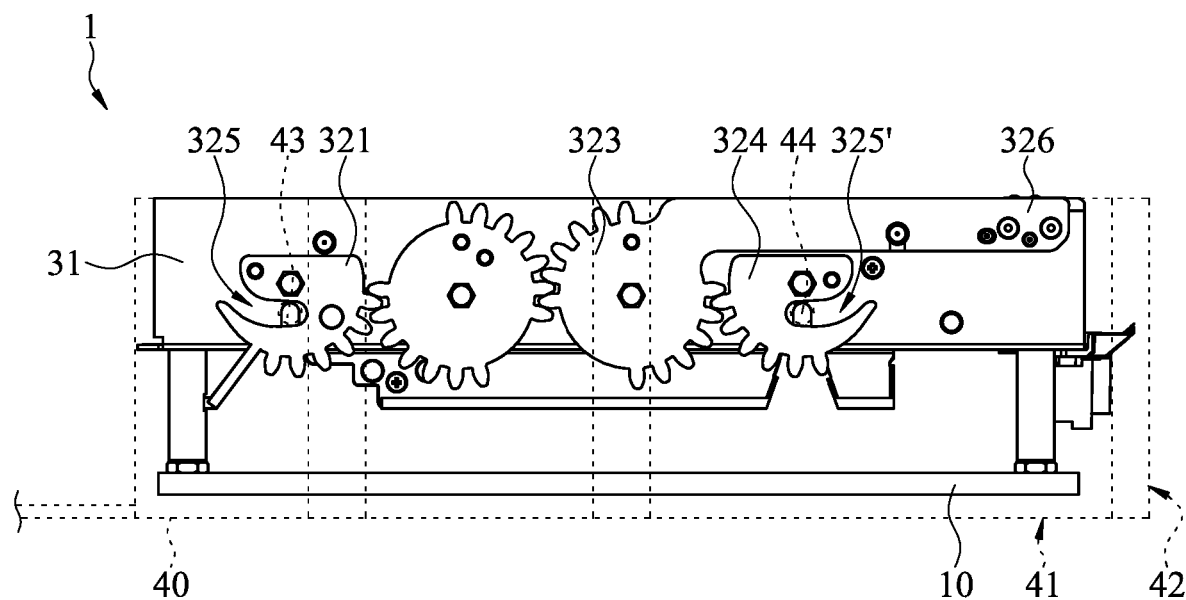
FIG. 13 is a schematic diagram in which a positioning pin of the server in FIG. 12 is located at the first position.

Referring to FIG. 13, FIG. 13 is a schematic diagram in which a positioning pin of the server in FIG. 12 is located at the first position. As shown in FIG. 12 and FIG. 13, the server 1 further includes a case 40, and the case 40 includes a bottom plate 41 and a side plate 42 connected to each other. The server motherboard 10 is fixed to the bottom plate 41, and the side plate 42 includes a first positioning block 43. The first positioning block 43 corresponds to the first gear 321 after the server motherboard 10 fixed to the case 40 is connected to the expansion circuit board 50. The first gear 321 is provided with a guide groove 325, and the guide groove 325 may be snap-fitted to the first positioning block 43 in response to the positioning pin 341 being moved from the first position to the second position (as shown in FIG. 3A and FIG. 3B). In this case, the expansion tray 30 may be buckled to the first positioning block 43 through the first gear 321, so that the case 40 may be stably connected to the expansion tray 30, thereby preventing the expansion tray 30 from being detached from the case 40.

Referring to FIG. 13 again, the linkage assembly 32 further includes a third gear 323, a fourth gear 324, and a grip 326. The third gear 323 and the fourth gear 324 are pivotally connected to the tray body 31, the third gear 323 is engaged with the second gear 322 and the fourth gear 324, and the grip 326 is connected to the third gear 323. In response to the user pulling the grip 326 (clockwise), the third gear 323 may rotate along with the grip 326, and the third gear 323 may drive the second gear 322, so that second gear 322 and the first gear 321 are linked to rotate. The first gear 321 may be buckled to the first positioning block 43 in response to the positioning pin 341 being moved from the first position to the second position (as shown in FIG. 3A and FIG. 3B), so that the case 40 may be connected and fixed to the expansion tray 30. In addition, the positioning pin 341 may be located in the limiting hole 21' of the limiting post 20' (as shown in FIG. 5) in response to the grip 326 indirectly driving the first gear 321 through the third gear 323, and the positioning pin 341 being moved from the first position to the second position (as shown in FIG. 3A and FIG. 3B), so that the server motherboard 10 is connected to the expansion tray 30.

Referring to FIG. 12 and FIG. 13 again, a distance between a center (which is an inner arc edge in the figure) of the guide groove 325 and a pivot center is gradually reduced. There may be a gradually pressing effect in response to the user pulling the grip 326 (clockwise), so that the expansion tray 30 is subjected to a pressing effect of the guide groove 325 on the first positioning block 43, the expansion tray 30 may further abut against the server motherboard 10, to achieve a better electrical contact effect between the two connectors (111, 151), and the electrical connection may still be maintained between the two connectors (111, 151) in a vibration environment.

Referring to FIG. 13 again, the side plate 42 further includes a second positioning block 44, and the fourth gear 324 includes a guide groove 325'. In response to the user pulling the grip 326 (clockwise), the third gear 323 may rotate along with the grip 326 and drive the fourth gear 324, and the guide groove 325' of the fourth gear 324 may further be snap-fitted to the second positioning block 44 in response to the positioning pin 341 being moved from the first position to the second position (as shown in FIG. 3A and FIG. 3B). Accordingly, the guide groove 325 of the first gear 321 and the guide groove 325' of the fourth gear 324 may be respectively snap-fitted to the first positioning block 43 and the second positioning block 44 after the user pulls the grip 326, so that the expansion tray 30 may be subjected to the pressing effect at different positions, thereby increasing a stable connection between the expansion tray 30 and the case 40.

Figure 14:
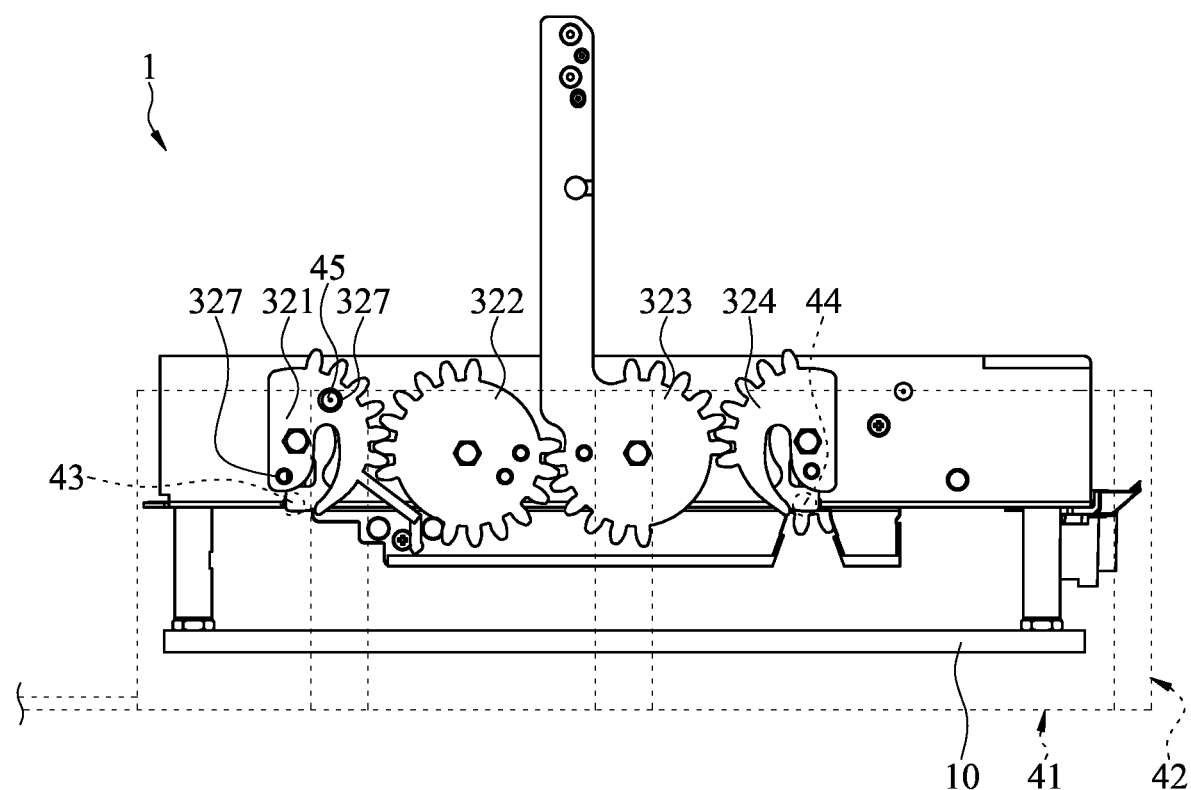
FIG. 14 is a schematic diagram in which the positioning pin of the server in FIG. 12 is located at the second position.

Referring to FIG. 14, FIG. 14 is a schematic diagram in which the positioning pin of the server in FIG. 12 is located at the second position. As shown in FIG. 14, in some embodiments, the side plate 42 of the server 1 is provided with at least one positioning bump 45. The first gear 321, the second gear 322, the third gear 323, and the fourth gear 324 each includes a positioning portion 327, and each positioning portion 327 is fixed by each corresponding positioning bump 45 in response to the positioning pin 341 being located at the first position (as the position shown in FIG. 3A). Accordingly, in response to the user not pulling the grip 326 (where the third gear 323 does not rotate), the first gear 321, the second gear 322, the third gear 323, and the fourth gear 324 may be all temporarily fixed by the corresponding positioning bump 45 through the positioning portion 327. In response to the user pulling the grip 326 to drive the third gear 323, the positioning portion 327 is forced to be detached from the positioning bump 45, and the first gear 321, the second gear 322, and the fourth gear 324 may be rotated, so that the positioning pin 341 being moved from the first position to the second position (as shown in FIG. 3B) along with the rotation of the first gear 321, thereby avoiding misoperation of the positioning pin 341.

Figure 15A:
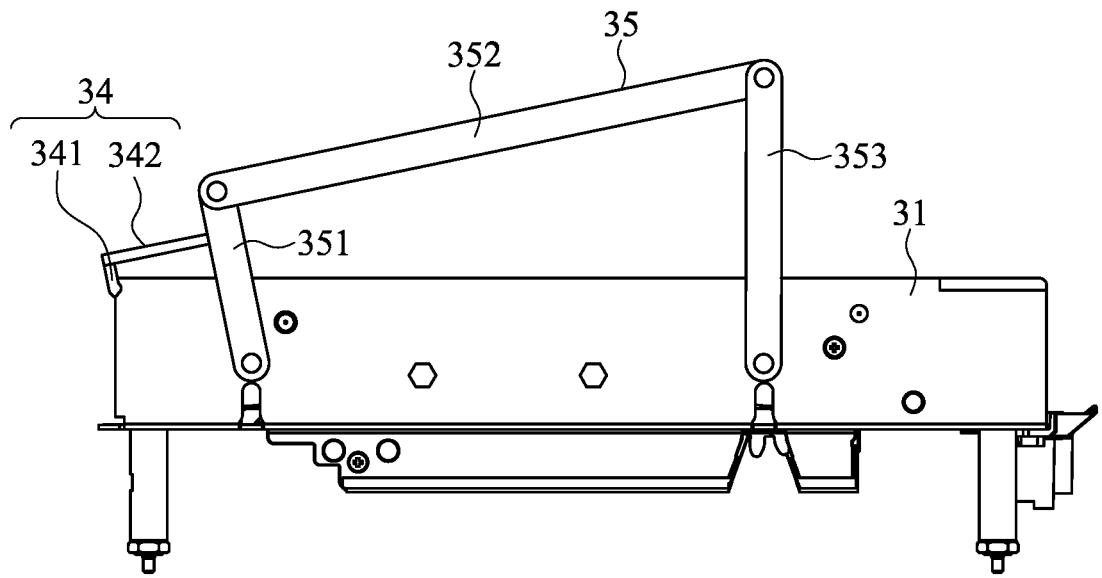
FIG. 15A is a front view of the server showing a state in which a positioning element is located at the first position according to some embodiments of the present invention.
Figure 15B:
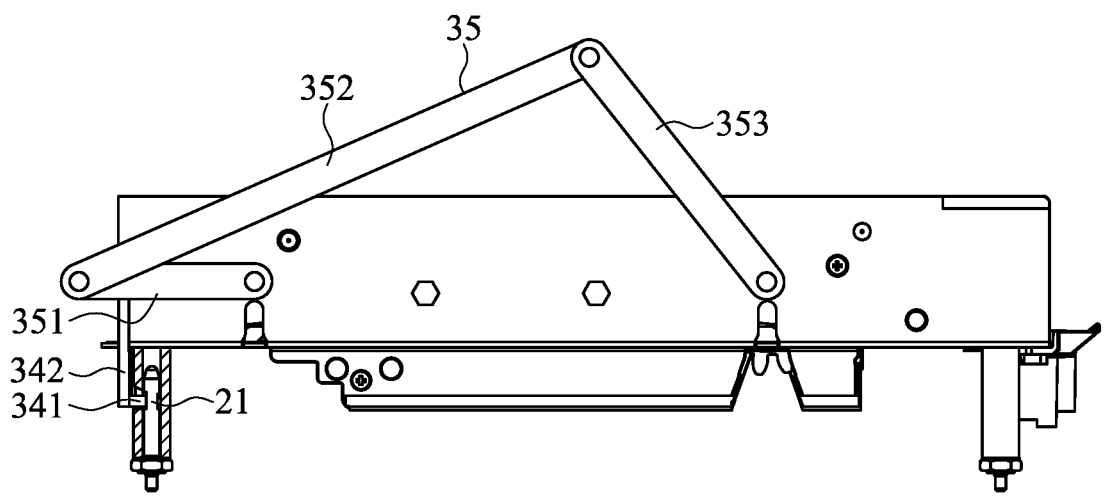
FIG. 15B is a front view of the server showing a state in which the positioning element is located at the second position according to some embodiments of the present invention.

Referring to FIG. 15A and FIG. 15B together, FIG. 15A is a front view of the server showing a state in which a positioning element is located at the first position according to some embodiments of the present invention. FIG. 15B is a front view of the server showing a state in which the positioning element is located at the second position according to some embodiments of the present invention. Referring to FIG. 1 and FIG. 2 together, in some embodiments, a linkage assembly 35 may be connecting rods. As shown in FIG. 15A, the linkage assembly 35 includes a first connecting rod 351, a second connecting rod 352, and a third connecting rod 353 that are pivotally connected in sequence. One end of the first connecting rod 351 and one end of the third connecting rod 353 are respectively pivotally connected to two ends of the second connecting rod 352, and the other end of the first connecting rod 351 and the other end of the third connecting rod 353 are pivotally connected to the tray body 31. The first connecting rod 351 includes a positioning element 34, the positioning element 34 includes a positioning pin 341 and a connecting arm 342, and the connecting arm 342 is connected between the first connecting rod 351 and the positioning pin 341. In response to the user pulling the third connecting rod 353, the first connecting rod 351 and the second connecting rod 352 may be linked along with the third connecting rod 353, so that the first connecting rod 351 drives the connecting arm 342, the positioning pin 341 being moved from the first position, and the positioning pin 341 is located at the limiting portion 21 in response to the positioning pin 341 being located at the second position.

Based on the above, the positioning element of the server may be moved between the first position and the second position. The positioning element is located at the limiting element of the server motherboard in response to the positioning element being located at the second position. A limiting effect is generated between the positioning element and the limiting portion of the limiting element, and a relative position between the server motherboard and the expansion tray can be stably maintained in response to a vibration test being performed on the server motherboard.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A server, comprising:
a server motherboard;
a limiting element, having a limiting portion and the limiting element fixed to the server motherboard; and
an expansion tray, comprising:
a tray body;
a driven assembly, comprising a positioning element and fixed to the tray body; and
a matching element, fixed to the tray body and the matching element matched with the limiting element, wherein
the positioning element has a first position and a second position, and the positioning element is located at the limiting portion in response to the positioning element being located at the second position, wherein
the driven assembly comprises a first gear and a second gear, the first gear and the second gear are respectively pivotally connected to the tray body, and the first gear is engaged with the second gear; and the positioning element comprises a positioning pin and a connecting arm, the connecting arm is connected between the first gear and the positioning pin, wherein
the limiting element is a limiting post, the matching element is a sleeve, the sleeve is sleeved on the limiting post, and the limiting portion is exposed from the sleeve.

2. The server according to claim 1, wherein the sleeve is provided with a through hole, and the limiting portion is exposed through the through hole in response to the sleeve being sleeved on the limiting post.

3. The server according to claim 2, wherein the limiting portion is a limiting hole, in response to the sleeve being sleeved on the limiting post, the limiting hole corresponds to the through hole, an upper edge of the through hole is substantially aligned with or higher than an upper edge of the limiting hole, and the positioning pin is substantially in contact with the upper edge of the limiting hole.

4. The server according to claim 3, wherein the positioning pin comprises a first guiding surface at an end facing the limiting post, and the first guiding surface is used for guiding the positioning pin to enter the limiting hole.

5. The server according to claim 4, wherein the through hole comprises a second guiding surface used for guiding the positioning pin to enter the limiting hole; the limiting hole comprises a third guiding surface, and the third guiding surface is used for guiding the positioning pin to enter the limiting hole; and an aperture of the limiting hole gradually decreases along an entering direction of the positioning pin.

6. A server, comprising:
a server motherboard;
a limiting element, having a limiting portion and the limiting element fixed to the server motherboard; and
an expansion tray, comprising:

a tray body;
a driven assembly, comprising a positioning element and fixed to the tray body; and
a matching element, fixed to the tray body and the matching element matched with the limiting element, and
a case, wherein the case comprises a bottom plate and a side plate connected to each other, and the server motherboard is fixed to the bottom plate; and the side plate comprises a first positioning block, the first gear is provided with a guide groove, and the guide groove is snap-fitted to the first positioning block in response to the positioning pin being moved from the first position to the second position;
wherein the positioning element has a first position and a second position, and in response to the positioning element being located at the second position, the positioning element is located at the limiting portion to maintain the matching relationship between the matching element and the limiting element;
wherein the driven assembly comprises a first gear and a second gear, the first gear and the second gear are respectively pivotally connected to the tray body, and the first gear is engaged with the second gear; and the positioning element comprises a positioning pin and a connecting arm, the connecting arm is connected between the first gear and the positioning pin.

7. The server according to claim 6, wherein the driven assembly further comprises a third gear, a fourth gear, and a grip, the third gear and the fourth gear are pivotally connected to the tray body, the third gear is engaged with the second gear and the fourth gear, and the grip is connected to the third gear.

8. The server according to claim 7, wherein the side plate comprises a second positioning block, the fourth gear is provided with a guide groove, and the guide groove of the fourth gear is snap-fitted to the second positioning block in response to the positioning pin being moved from the first position to the second position.

9. The server according to claim 8, further comprising an expansion circuit board, wherein the expansion circuit board is electrically connected to the server motherboard in response to the positioning pin being moved from the first position to the second position.

10. The server according to claim 9, wherein the side plate is provided with at least one positioning bump, the first gear, the second gear, the third gear, and the fourth gear each comprises a positioning portion, and each positioning portion is fixed by each corresponding positioning bump in response to the positioning pin being located at the first position.

11. An expansion tray, adapted to a support structure for a server motherboard, wherein the support structure comprises a limiting element, and the expansion tray comprises:
a tray body;
a driven assembly, comprising a positioning element and fixed to the tray body; and
a sleeve, fixed to the tray body and the sleeve matched with the limiting element, wherein
the positioning element has a first position and a second position, and in response to the positioning element being located at the second position, the positioning element is located at a limiting hole of the limiting element to maintain the matching relationship between the sleeve and the limiting element;
wherein the matching element is a sleeve, and the sleeve is provided with a through hole; the limiting portion is a limiting hole, and in response to the sleeve being sleeved on the limiting element, the limiting hole corresponds to the through hole, and an upper edge of the through hole is substantially aligned with or higher than an upper edge of the limiting hole; and the positioning element comprises a positioning pin, and the positioning pin is substantially in contact with the upper edge of the limiting hole.

12. The expansion tray according to claim 11, wherein the driven assembly comprises a first gear and a second gear, the first gear and the second gear are respectively pivotally connected to the tray body, and the first gear is engaged with the second gear; and a connecting arm is connected between the first gear and the positioning pin, and in response to the second gear being actuated, the first gear enables the positioning pin to move between the first position and the second position.

* * * * *